(12) United States Patent
Yabuki et al.

(10) Patent No.: US 6,721,342 B2
(45) Date of Patent: Apr. 13, 2004

(54) SEMICONDUCTOR LASER DEVICE

(75) Inventors: Yoshifumi Yabuki, Miyagi (JP);
Tsuyoshi Tojo, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/342,984

(22) Filed: Jan. 15, 2003

(65) Prior Publication Data
US 2003/0174753 A1 Sep. 18, 2003

(30) Foreign Application Priority Data
Apr. 17, 2002 (JP) ........................................ 2002-008334

(51) Int. Cl.[7] .................................................. H01S 3/04
(52) U.S. Cl. ........................................... 372/36; 372/34
(58) Field of Search ................................ 372/50, 36, 34

(56) References Cited
U.S. PATENT DOCUMENTS 5,515,391 A  *  5/1996  Endriz .......................... 372/34
5,805,630 A  *  9/1998  Valster et al. ................. 372/50
6,136,623 A  * 10/2000  Hofstetter et al. ............ 438/28
6,553,044 B1 *  4/2003  Eden ........................ 372/38.02

* cited by examiner

*Primary Examiner*—Quyen Leung
(74) *Attorney, Agent, or Firm*—Robert J. Depke; Holland & Knight LLP

(57) ABSTRACT

Disclosed is an array type semiconductor laser device including a plurality of semiconductor laser chips each of which has an active layer for forming a light emitting point, wherein the semiconductor laser chips are arrayed on the same substrate in such a manner as to be spaced from each other at intervals. In this laser device, an array configuration of the semiconductor laser chips is specified such that a gap between arbitrary adjacent two laser chips located inwardly from both outermost laser chips positioned at both the edges of the semiconductor laser device is wider than a gap between each of said outermost laser chips and an LD chip adjacent thereto. This laser device is advantageous in reducing the effect of thermal interference mutually exerted on the laser chips, thereby ensuring a thermal uniformity over the entire laser chips.

2 Claims, 3 Drawing Sheets

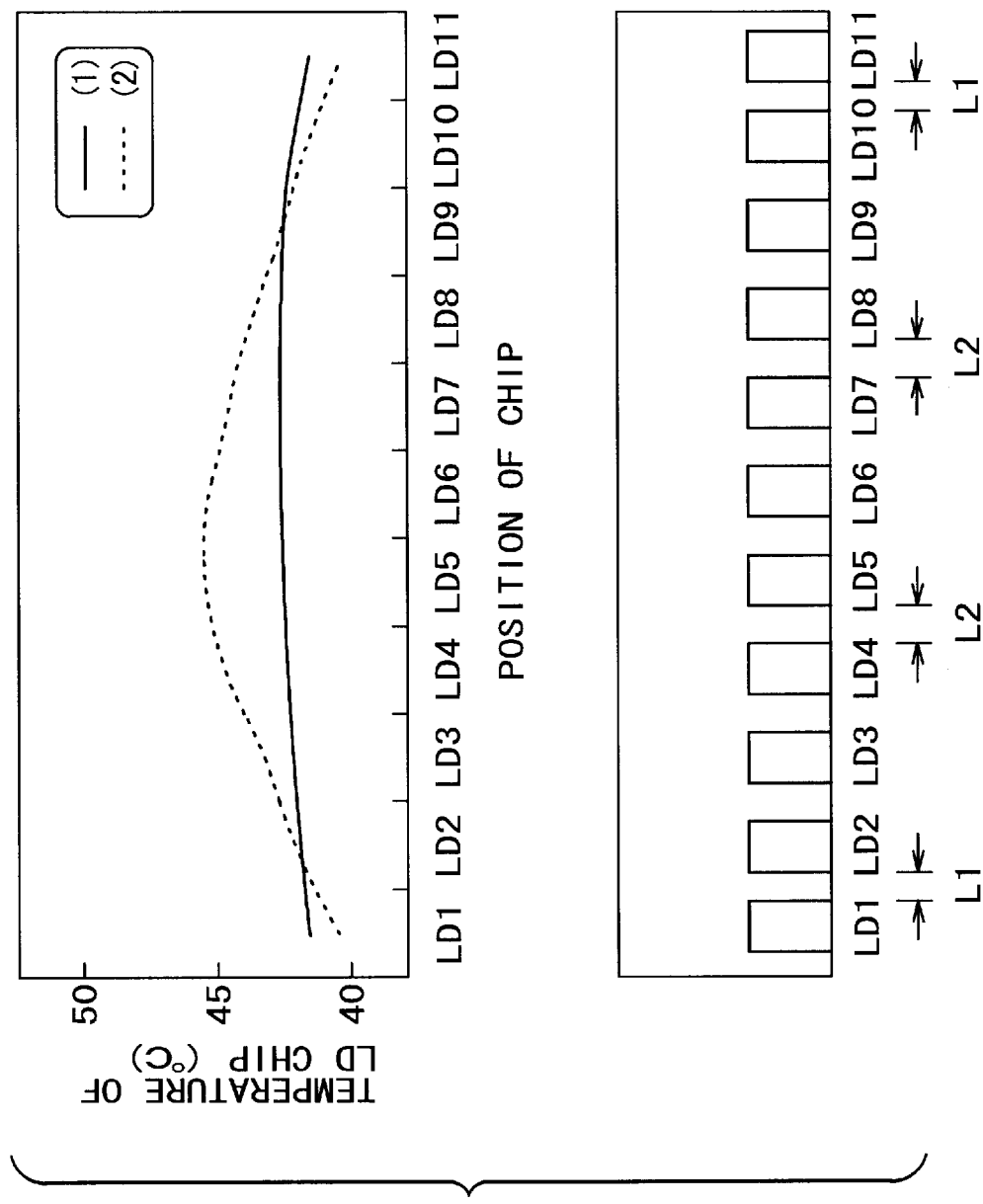

SEMICONDUCTOR LASER DEVICE

This application claims priority to Japanese Patent Application No. JP2002-008334 filed Han. 17, 2002, which is incorporated herein by reference.

BACKGROUND OF THE INVENTION

The present invention relates to a semiconductor laser device, and particularly to a high output array type semiconductor laser device including an array of a plurality of semiconductor laser chips.

Recently, semiconductor laser devices have been required to have a higher output performance, and to meet such a requirement, efforts have been made to develop array type semiconductor laser devices each including an array of a plurality of semiconductor laser chips (hereinafter, referred to as "LD chips").

Such array type semiconductor laser devices have been used in various applications including those associated with medical treatment, optical communication, and the like.

FIG. 3 shows one example of a related art array type semiconductor laser device which includes a plurality of LD chips 21 arrayed on an electrode pattern 13 formed on a sub-mount 12 in such a manner as to be spaced from each other in specific intervals L.

Each of the LD chips 21 has a p-electrode 14 and an n-electrode 15. The LD chips 21 are each activated by injecting a current between both the electrodes 14 and 15, to output laser light from a light emitting point 16 formed in an active layer (not shown) of the LD chip 21.

In this semiconductor laser device, since the LD chips are arrayed in proximity to each other, when the LD chips are individually activated with high outputs, thermal interference may occur among the LD chips due to beat generated by high laser oscillation.

A test for examining thermal interference among LD chips has been performed by example of a semiconductor laser device having the same structure as that shown in FIG. 3.

The semiconductor laser device used in this test is specified such that 11 pieces of LD chips 21 (numbered with LD1 to LD11 in this order from one edge of the semiconductor laser device) are arrayed on the sub-mount 12 in such a manner as to be spaced from each other at equal intervals L, wherein the width of each LD chip is 288 $\mu$m and the gap (interval) L between the adjacent LD chips is set to 21 $\mu$m.

The result of this test is shown in FIG. 4. In this graph, the abscissa indicates an array position of each LD chip and the ordinate indicates a temperature of the LD chip.

From this graph, it becomes apparent that as the array position of the LD chip becomes closer to the center side of the semiconductor laser device, the number of the LD chips exerting the thermal interference on the LD chip closer to the center side becomes larger, with a result that the temperature of the LD chip closer to the center side becomes higher. Such an LD chip whose temperature has been significantly raised due to thermal interference has a problem that the optical output thereof is reduced and the current is liable to be concentrated thereat, whereby the service life of the LD chip is shortened.

To prevent thermal interference in an array type semiconductor laser device, various methods have been proposed. For example, a method of improving the structure of a heat sink on which LD chips are to be arrayed has been disclosed in Japanese Patent Laid-open No. Hei 6-112596, and a method of controlling the temperature distribution of LD chips by disposing a dummy LD chip causing no laser oscillation among the LD chips has been disclosed in Japanese Patent Laid-open No. Hei 9-83056. In each of these methods, however, it fails to realize a sufficient thermal uniformity over the entire LD chips of the array type semiconductor laser device.

SUMMARY OF THE INVENTION

An object of the present invention is to provide an array type semiconductor laser device including an array of LD chips, which is capable of reducing the effect of thermal interference mutually exerted on the LD chips, thereby ensuring a thermal uniformity over the entire LD chips.

To achieve the above object, according to an aspect of the present invention, there is provided a semiconductor laser device including a plurality of semiconductor laser chips each of which has an active layer for forming a light emitting point, said semiconductor laser chips being arrayed on the same substrate in such a manner as to be spaced from each other at intervals, wherein said plurality of semiconductor laser chips are arrayed such that a gap between arbitrary adjacent two laser chips located inwardly from both outermost laser chips positioned at both the edges of said semiconductor laser device is wider than a gap between each of said outermost laser chips and an LD chip adjacent thereto.

With this configuration, the semiconductor laser chips are arrayed such that the gap between arbitrary adjacent two laser chips located inwardly from both the outermost laser chips positioned at both the edges of said semiconductor laser device is wider than a gap between each of the outermost laser chips and an LD chip adjacent thereto. As a result, even if the semiconductor laser device is operated with a high output, each semiconductor laser chip located on the inner side of the semiconductor laser device is less susceptible to the effect of thermal interference exerted from the other semiconductor laser chips. This makes it possible to reduce a deviation in temperature rise among the semiconductor laser chips and ensure a thermal uniformity over the entire semiconductor laser chips, and hence to equalize characteristics of the semiconductor laser chips.

The semiconductor laser device according to the present invention is thus advantageous in suppressing the reduction in optical output of a specific semiconductor laser chip due-to temperature rise, thereby maximizing the optical output of the semiconductor laser device,-and also advantageous in eliminating an inconvenience that the current is concentrated at a specific semiconductor laser chip whose temperature has been raised due to thermal interference, thereby preventing the shortening of the service life of each semiconductor laser chip.

BRIEF DESCRIPTION OF THE DRAWINGS

The above and other objects and features of the present invention will become apparent from the following detailed description taken in conjunction with the accompanying drawings, in which:

FIG. 2 is a graph showing a relationship between an array position of each of semiconductor laser chips of the semiconductor laser device according to the present invention and a temperature of the semiconductor laser chip;

DETAILED DESCRIPTION OF THE PREFERRED EMBODIMENT

Hereinafter, a preferred embodiment of a semiconductor laser device according to the present invention will be described with reference to the drawings.

Figure 1A:
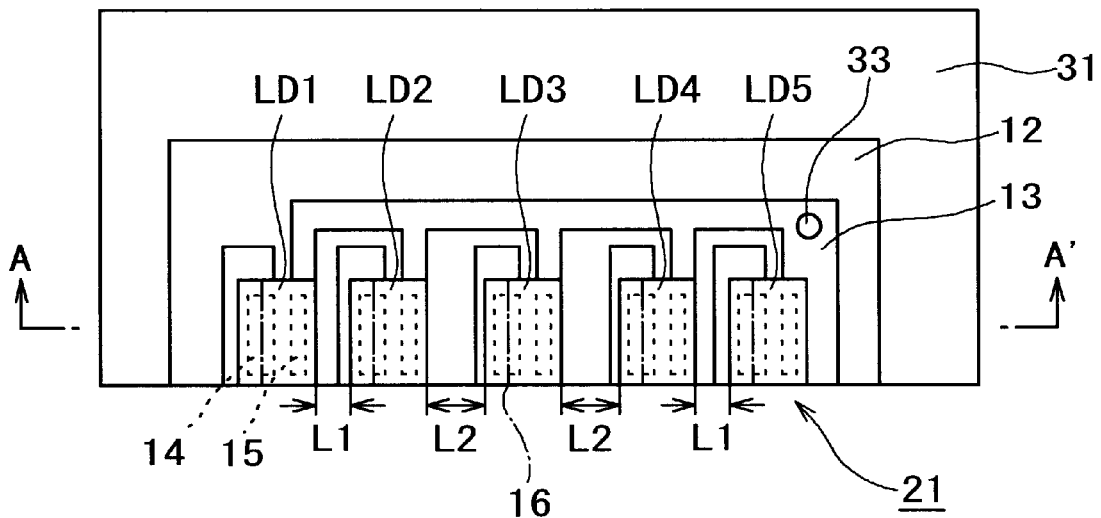
FIG. 1A is a top view of a semiconductor laser device according to an embodiment of the present invention.
Figure 1B:
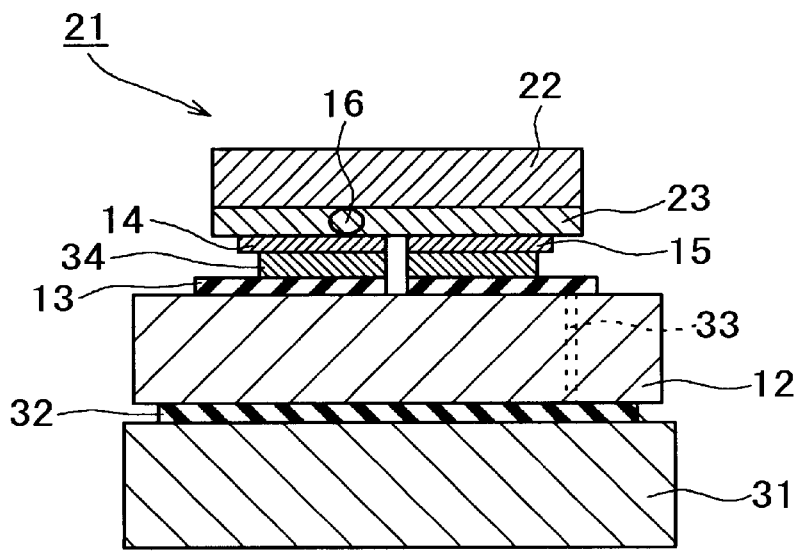
FIG. 1B is an enlarged sectional view taken on line A–A' of FIG. 1A, showing an essential portion of the semiconductor laser device.
Figure 3:
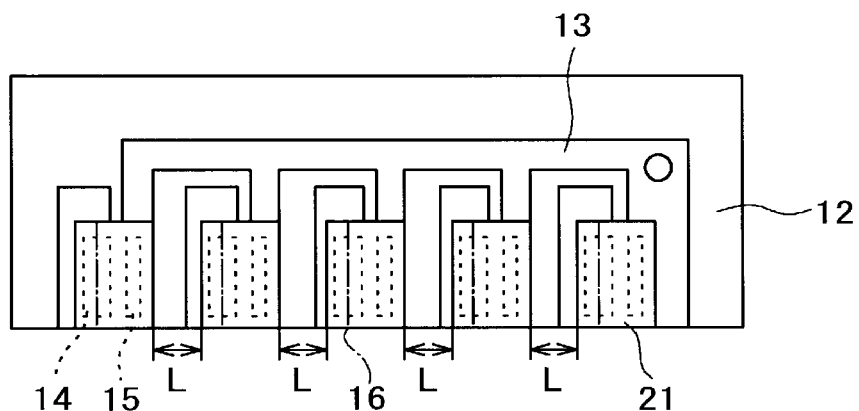
FIG. 3 is a top view of a related art semiconductor laser device.

FIG. 1A is a top view of a semiconductor laser device according to this embodiment, and FIG. 1B is an enlarged sectional view taken on line A–A' of FIG. 1A, showing an essential portion of the semiconductor laser device. It is to be noted that in the drawings, the same parts as those of the related art semiconductor laser device are denoted by the same reference numerals.

Referring to FIG. 1A, there is shown a semiconductor laser device including five pieces of LD chips 21. To be more specific, a sub-mount 12 made from aluminum nitride (AlN) is disposed on a heat sink 31 made from copper, and the LD chips 21 are arrayed on the sub-mount 12 in such a manner as to be spaced from each other at intervals.

The material of the sub-mount 12 is not limited to aluminum nitride (AlN) but may be any other material having a good heat dissipation characteristic, for example, silicon, silicon carbide, or diamond.

The mounting configuration of the LD chips 21 on the sub-mount 12 will be fully described with reference to FIG. 1B.

The sub-mount 12 is disposed on the heat sink 31 via a back electrode 32 formed on the back surface side of the sub-mount 12, and an electrode pattern 13 is formed on the front surface of the sub-mount 12 in such a manner as to be connected to the back electrode 32 via a lead-through conductive portion 33.

Each LD chip 21 includes a sapphire substrate 22, an active layer 23 formed from a gallium nitride (GaN) based compound semiconductor on a principal plane of the sapphire substrate 22, and a p-electrode 14 and an n-electrode 15 formed on the active layer 23 side. The p-electrode 14 and the n-electrode 15 are fused on the electrode pattern 13 by means of a solder 34 made from tin (Sn) or the like.

Each LD chip 21 outputs laser light from a light emitting point 16 formed in the active layer 23 by injecting a current between the p-electrode 14 and the n-electrode 15.

Referring again to FIG. 1A, according to the semiconductor laser device of the present invention, the LD chips 21 are arrayed on the sub-mount 12 such that a gap L2 between arbitrary adjacent two LD chips 21 located inwardly from both the outermost LD chips 21 located at both the edges of the semiconductor laser device is wider than a gap L1 between each of the outermost LD chips 21 and an LD chip 21 adjacent thereto.

The array configuration of the LD chips 21 of the semiconductor laser device according to the present invention will be more fully described below.

As shown in FIG. 1A, the five LD chips 21 (which are numbered with LD1 to LD5 in this order from one edge of the semiconductor laser device), each of which has a width of 288 μm, are arrayed on the sub-mount 12. In this array of the LD chips LD1 to LD5, a gap between the outermost LD chip LD1 at one edge (left edge) and the LD chip LD2 adjacent thereto is taken as L1, and a gap between the adjacent two LD chips LD2 and LD3 disposed inwardly from the outermost LD chip LD1 is taken as L2, and similarly, a gap between the outermost LD chip LD5 at the other edge (right edge) and the LD chip LD4 adjacent thereto is taken as L1, and a gap between the adjacent two LD chips LD4 and LD3 disposed inwardly from the outermost LD chip LD5 is taken as L2.

According to this embodiment, the gap L1 is set to 212 μm and the gap L2 is set to 280 μm (which is as large as about 1.3 times the gap L1).

It is to be noted that electrodes of the electrode pattern 13 are located at positions corresponding to the array positions of these LD chips 21.

In this semiconductor laser device, the plurality of LD chips 21 are arrayed such that the gap L2 between arbitrary adjacent two LD chips 21 located inwardly from both the outermost LD chips 21 located at both the edges of the semiconductor laser device is about 1.3 times wider than the gap L1 between each of the outermost LD chips 21 and an LD chip 21 adjacent thereto. As a result, each LD chip 21 located on the inner side of the semiconductor laser device is less susceptible to the effect of thermal interference exerted from the other LD chips 21. This makes it possible to reduce a deviation in temperature rise among the LD chips 21 and hence to ensure a thermal uniformity over the entire LD chips 21.

A test for examining thermal interference among LD chips has been performed by example of a semiconductor laser device having the same structure as that shown in FIGS. 1A and 1B.

The semiconductor laser device used in this test is specified such that 11 pieces of LD chips 21 (numbered with LD1 to LD11 in this order from one edge of the semiconductor laser device), each having a width of 288 μm, are arrayed on the sub-mount 12. In this array of the LD chips LD1 to LD 11, a gap between the outermost LD chip LD1 located at one edge (left edge) and the LD chip LD2 adjacent thereto is taken as L1 and a gap between the outermost LD chip LD11 located at the other edge (right edge) and the LD chip LD10 adjacent thereto is taken as L1, and a gap between arbitrary adjacent two of the LD chips LD2 to LD10 located inwardly from both the outermost LD chips LD1 and LD11 is taken as L2.

In this test, the gap L1 is set to 212 mm and the gap L2 is set to 280 μm (which is as large as about 1.3 times the gap L1).

The result of this test is shown in FIG. 2. In this graph, the abscissa indicates an array position of each LD chip and the ordinate indicates a temperature of the LD chip.

Figure 4:
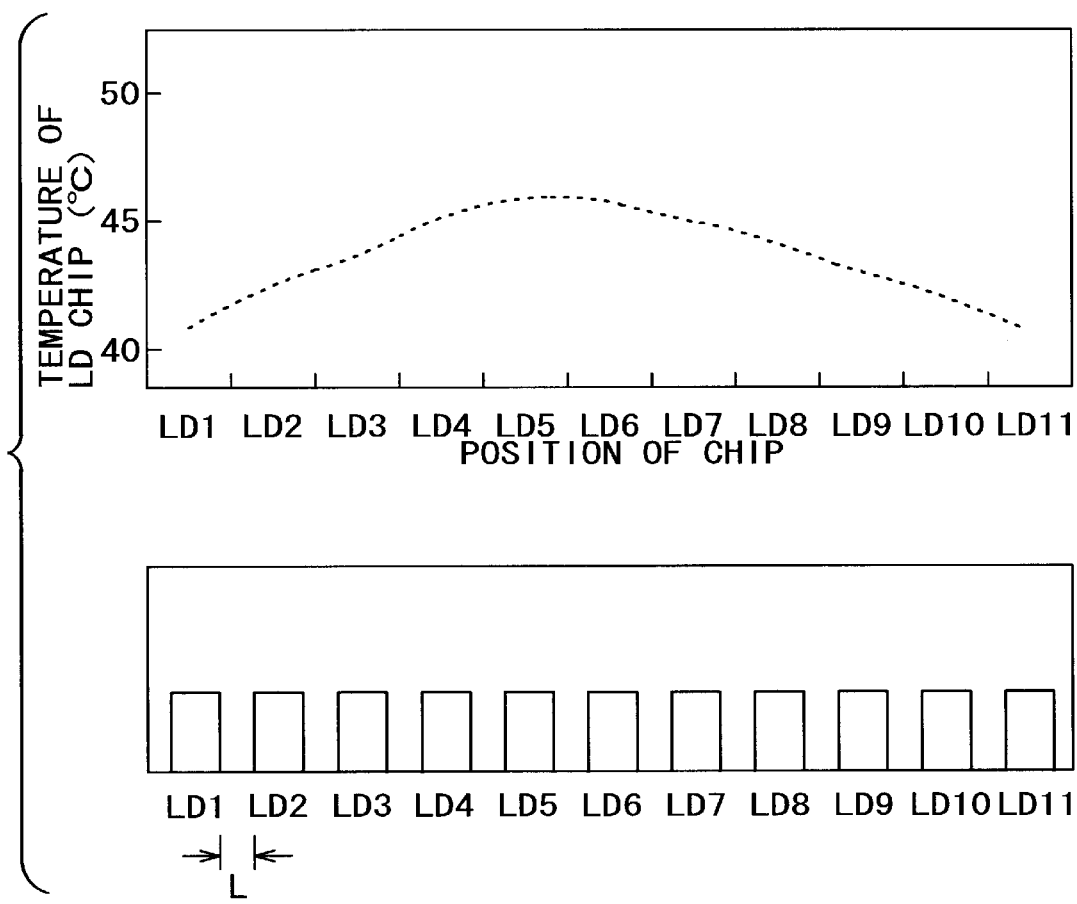
FIG. 4 is a graph showing a relationship between an array position of each of semiconductor laser chips of the related art semiconductor laser device and a temperature of the semiconductor laser chip.

In FIG. 2, a curve (1) shows a temperature distribution of the LD chips 21 of the semiconductor laser device according to the present invention, wherein the LD chips 21 are arrayed such that the gap between arbitrary adjacent two LD chips 21 located inwardly from both the outermost LD chips 21 is wider than the gap between each of the outermost LD chips 21 and an LD chip 21 adjacent thereto, and a curve (2) shows a temperature distribution of the LD chips of the related art semiconductor laser device described with reference to FIG. 4, wherein the LD chips are arrayed in such a manner as to be spaced from each other at the equal intervals (L=212 μm).

As is apparent from this graph, the array configuration of the LD chips 21 of the semiconductor laser device according to the present invention is advantageous in eliminating a deviation in temperature rise among the LD chips 21, thereby ensuring a thermal uniformity over the entire LD chips 21.

According to this embodiment, the array configuration of the LD chips 21 is specified such that the inner gap L2 between arbitrary adjacent two LD chips 21 located inwardly from both the outermost LD chips 21 is about 1.3 times wider than the outer gap L1 between each of the outermost LD chips 21 and an LD chip 21 adjacent thereto; however, the present invention is not limited thereto but may be configured such that the array configuration of the LD chips 21 be specified such that the inner gap L2 is wider than the outer gap L1.

In particular, by specifying the array configuration of the LD chips 21 such that the inner gap L2 becomes about 2 times wider than the outer gap L1, it is possible to more sufficiently ensure a thermal uniformity over the entire LD chips 21

According to the present invention, the array configuration of the LD chips 21 may be specified such that as the array position of an LD chip 21 becomes closer to the center side of the semiconductor laser device, the gap between the LD chip 21 becoming closer to the center side and an LD chip adjacent thereto becomes stepwise wider, or such that a first outer gap between each of the outermost LD chips 21 and an LD chip 21 adjacent thereto is equal to a second outer gap between the adjacent two LD chips 21 subsequent thereto, and ah inner gap between arbitrary adjacent two LD chips 21 located inwardly from the above outer LD chips 21 is wider than the outer gap.

In this way, the concrete array intervals (gaps) among the LD chips 21 may be optimized depending on, for example, the material for forming the LD chips on the basis of a simulation result or the like.

Since a semiconductor laser device configured such that an active layer 23 of each semiconductor laser chip is made from a nitride, for example, a GaN based compound semiconductor as described in this embodiment requires large power consumption, it is particularly recommended to apply the present invention to such a semiconductor laser device.

However, the present invention is not limited thereto but may be configured such that the active layer 23 is made from a GaAs based compound semiconductor or other materials.

While the preferred embodiment of the present invention has been described using specific terms, such description is for illustrative purposes only, and it is to be understood that changes and variations may be made without departing from the spirit or scope of the following claims.

What is claimed is:

1. A semiconductor laser device comprising:
    a plurality of semiconductor laser chips each of which has an active layer for forming a light emitting point, said semiconductor laser chips being arrayed on the same substrate in such a manner as to be spaced from each other at intervals;
    wherein said plurality of semiconductor laser chips are arrayed such that a gap between arbitrary adjacent two laser chips located inwardly from both outermost laser chips positioned at both the edges of said semiconductor laser device is wider than a gap between each of said outermost laser chips and an LD chip adjacent thereto.

2. A semiconductor laser device according to claim 1, wherein said active layer is made from a nitride compound.

* * * * *